US009842813B2

(12) United States Patent
Jiang et al.

(10) Patent No.: US 9,842,813 B2
(45) Date of Patent: Dec. 12, 2017

(54) TRANMISSION LINE BRIDGE INTERCONNECTS

(71) Applicant: Altera Corporation, San Jose, CA (US)

(72) Inventors: Xiaohong Jiang, San Jose, CA (US); Yuanlin Xie, Fremont, CA (US)

(73) Assignee: ALTERA CORPORATION, San Jose, CA (US)

( * ) Notice: Subject to any disclaimer, the term of this patent is extended or adjusted under 35 U.S.C. 154(b) by 49 days.

(21) Appl. No.: 14/860,565

(22) Filed: Sep. 21, 2015

(65) Prior Publication Data

US 2017/0084553 A1   Mar. 23, 2017

(51) Int. Cl.
*H05K 1/18* (2006.01)
*H01L 23/66* (2006.01)
*H05K 1/02* (2006.01)
*H01P 3/08* (2006.01)
*H05K 1/14* (2006.01)
(Continued)

(52) U.S. Cl.
CPC .............. *H01L 23/66* (2013.01); *H01L 23/13* (2013.01); *H01L 23/36* (2013.01); *H01L 23/5385* (2013.01); *H01P 3/081* (2013.01); *H05K 1/025* (2013.01); *H05K 1/0243* (2013.01); *H05K 1/141* (2013.01); *H05K 1/183* (2013.01); *H01L 24/13* (2013.01); *H01L 24/16* (2013.01); *H01L 24/73* (2013.01); *H01L 2223/6627* (2013.01); *H01L 2224/131* (2013.01); *H01L 2224/16227* (2013.01); *H01L 2224/73253* (2013.01); *H01L 2924/15159* (2013.01); *H01L 2924/15192* (2013.01); *H01L 2924/15311* (2013.01); *H05K 2201/10378* (2013.01)

(58) Field of Classification Search
USPC .......................................... 361/764; 257/678
See application file for complete search history.

(56) References Cited

U.S. PATENT DOCUMENTS 3,303,439 A    6/1965  Fulp
3,747,044 A    7/1973  Vaccaro
(Continued)

FOREIGN PATENT DOCUMENTS

JP         2005353925       12/2005

*Primary Examiner* — Andargie M Aychillhum
(74) *Attorney, Agent, or Firm* — Treyz Law Group, P.C.; Joseph F. Guihan

(57) ABSTRACT

In one embodiment, an integrated circuit package includes a package substrate, a printed circuit board, an interposer structure and a transmission line bridge interconnect within the interposer. The interposer structure, which includes multiple interposer layers, may be formed on a top surface of the package substrate. The printed circuit board may be coupled to the package substrate through the transmission line bridge interconnect. The transmission line may be formed on at least one of the interposer layers. The transmission line may be utilized to convey signals between the package substrate and the printed circuit board. The transmission line may be a stripline transmission line or a micro-strip transmission line. The transmission line may have a low parasitic inductance and implementation of the transmission line does not introduce large dimensional discontinuity throughout that signal pathway. The integrated circuit package may be part of a circuit system that includes external circuits.

22 Claims, 5 Drawing Sheets

(51) Int. Cl.
*H01L 23/13* (2006.01)
*H01L 23/36* (2006.01)
*H01L 23/538* (2006.01)
*H01L 23/00* (2006.01)

(56) References Cited

U.S. PATENT DOCUMENTS

| | | | |
|---|---|---|---|
| 4,574,235 | A | 3/1986 | Kelly et al. |
| 4,626,805 | A | 12/1986 | Jones |
| 4,737,123 | A | 4/1988 | Paler et al. |
| 5,363,075 | A | 11/1994 | Fanucchi |
| 6,407,652 | B1 | 6/2002 | Kan |
| 7,294,904 | B1 * | 11/2007 | Chee .............. H05K 1/025 257/528 |
| 7,498,907 | B2 | 3/2009 | Suzuki et al. |
| 8,288,175 | B2 | 10/2012 | Loiselet |
| 2005/0230795 | A1 * | 10/2005 | Furuyama .......... G02B 6/4201 257/678 |
| 2011/0309899 | A1 | 12/2011 | Leiba et al. |
| 2012/0112784 | A1 | 5/2012 | Masuda et al. |
| 2013/0194754 | A1 | 8/2013 | Jung et al. |
| 2013/0200511 | A1 * | 8/2013 | Banijamali ........ H01L 25/0652 257/737 |
| 2013/0257565 | A1 * | 10/2013 | Masuda ............... H01P 3/02 333/247 |
| 2014/0285389 | A1 | 9/2014 | Fakharzadeh et al. |
| 2014/0291819 | A1 * | 10/2014 | Barth ............... H01L 23/53276 257/659 |
| 2015/0028470 | A1 * | 1/2015 | Gallegos .......... H01L 23/49811 257/737 |
| 2016/0276727 | A1 * | 9/2016 | Dang ................. H01P 5/02 |

* cited by examiner

ID
TRANMISSION LINE BRIDGE INTERCONNECTS

BACKGROUND

Generally, a circuit system has multiple integrated circuit packages placed on a printed circuit board (PCB). Each integrated circuit package is coupled to the printed circuit board using a particular type of interconnect structure. Commonly known interconnect structures at the package/PCB interface include ball grid arrays (BGAs), land grid arrays (LGAs), pin grid arrays (PGAs) and surface mounted technology (SMT) pins.

However, these interconnect structures may not be able to support a high-speed circuit system (e.g., a circuit system with a data transfer rate that is greater than 25 gigabits per second (Gbps)). Such a limitation may be due to: (i) dimension mismatches between structures utilized to transmit signals within a package substrate and at the package/PCB interface, and (ii) parasitic inductances of the interconnect structures.

In most interconnect structures, the largest dimension mismatch is observed between a micro-via, a plated through-hole (PTH) via, and a BGA ball. Parasitic inductance may be an intrinsic characteristic of a pin that forms part of the interconnect structure. The parasitic inductance causes an inductive impedance mismatch for a transmitted signal. Hence, the two limitations can reduce the bandwidth of the interconnect structures and can increase unwanted higher-order mode signal problems in a high-speed circuit system.

The above-mentioned problems are sometimes resolved using micro-wave interconnect technology. However, micro-wave interconnect technology generally involves a large diameter (i.e., 3 millimeter (mm)) as a result of similar designs to a coaxial pin structure. This significantly reduces channel density between an integrated circuit package and a printed circuit board.

SUMMARY

Embodiments described herein include transmission line bridge interconnects. It should be appreciated that the embodiments can be implemented in numerous ways, such as a process, an apparatus, a system, a device, or a method. Several embodiments are described below.

In one embodiment, an integrated circuit package includes a package substrate, an interposer structure, a printed circuit board and a transmission line. The interposer structure, which includes multiple interposer layers, may be formed at a top surface of the package substrate. The printed circuit board may be coupled to the package substrate. The transmission line may be formed on at least one of the interposer layers. The transmission line may be utilized to convey signals between the package substrate and the printed circuit board. In one embodiment, the transmission line may be a stripline transmission line or a micro-strip transmission line. The transmission line may have a low parasitic inductance and implementation of the transmission line does not introduce large dimensional discontinuity throughout a signal pathway. The integrated circuit package may be part of a circuit system that includes external circuits.

Further features of the invention, its nature and various advantages will be more apparent from the accompanying drawings and the following detailed description of the preferred embodiments.

DETAILED DESCRIPTION

The following embodiments describe an integrated circuit package with transmission line bridge interconnects. It will be obvious, to one skilled in the art, that the present exemplary embodiments may be practiced without some or all of these specific details. In other instances, well-known operations have not been described in detail in order not to unnecessarily obscure the present embodiments.

Figure 1:
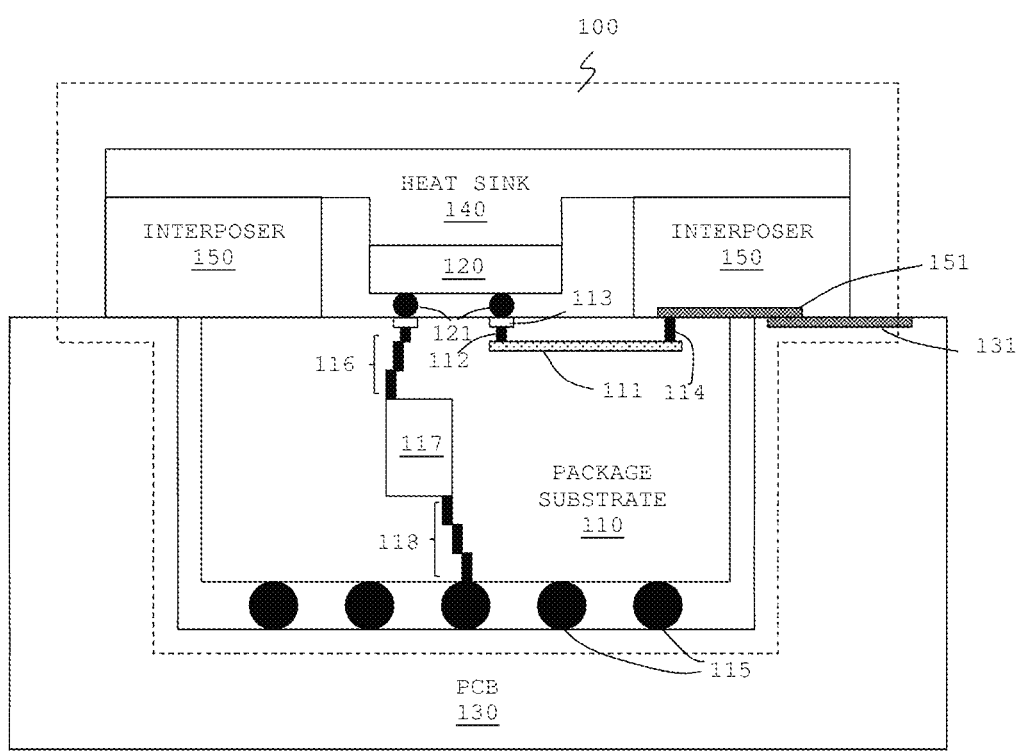
FIG. 1 shows an illustrative transmission line bridge interconnect that couples an integrated circuit package to a printed circuit board in accordance with an embodiment of the present invention.

FIG. 1, meant to be illustrative and not limiting, illustrates a transmission line bridge interconnect that couples an integrated circuit package to a printed circuit board in accordance with one embodiment of the present invention. Integrated circuit package 100 includes integrated circuit die 120, package substrate 110, heat sink 140 and interposer 150. Printed circuit board 130 includes a cavity, in which package substrate 110 may be placed or formed.

Integrated circuit package 100 may be an application specific integrated circuit (ASIC) device or an application specific standard product (ASSP) device, in one embodiment. An ASIC or ASSP device has fixed functions and therefore, the ASIC or ASSP device may have specialized circuitry to perform the fixed functions. In one embodiment, the ASIC or ASSP device may be a memory controller device. Alternatively, integrated circuit package 100 may be a programmable logic device (PLD), such as a field programmable gate array (FPGA) device. An FPGA device may be programmed to perform different functions. Therefore, the FPGA device may include multiple of programmable logic elements to enable itself to be programmed to perform the various functions.

Integrated circuit die 120 may be a semiconductor die (e.g., a silicon die). Generally, integrated circuit die 120 performs the core functions of integrated circuit package 100. Integrated circuit die 120 may include multiple circuit structures, for example, complementary metal oxide semiconductor (CMOS) transistors, capacitors and inductor structures. The circuit structures may form functional circuitry that performs functions defined for integrated circuit die 120. For example, integrated circuit die 120 may have multiple functional circuitry (e.g., transceiver circuitry) that transfers data from an ASIC or ASSP device (e.g., a memory controller device) to a memory device (i.e., an external device). The transceiver circuitry may be capable of transmitting a signal (i.e., TX signal) or may receive a signal (i.e., a RX signal). Alternatively, integrated circuit die 120 may have multiple programmable logic elements and programmable interconnects within an FPGA device that perform various functions based on user requirements.

Referring still to FIG. 1, integrated circuit die 120 is mounted on a top surface of package substrate 110. Integrated circuit die 120 may be coupled to package substrate 110 through bumps 121 (e.g., in a flip chip assembly). In one embodiment, bumps 121 may be controlled collapse chip connection (C4) bumps. Each bump 121 may be coupled to its corresponding transceiver circuitry (not shown) within the integrated circuit die 120, in one embodiment. As shown in the embodiment of FIG. 1, for every bump 121 on integrated circuit die 120, there may be a corresponding bump pad 113 on package substrate 110. Input/output (I/O) signals may be transmitted between integrated circuit die 120 and package substrate 110 through at least some of the bumps 121 and bump pads 113. In one embodiment, the I/O signals may be high-speed signals, which carry information at a high data rate such as 25 gigabits per second (Gbps) or higher. Alternatively, radio-frequency data signals may be transmitted through a portion of bumps 121 and bump pads 113. The remaining bumps 121 and bump pads 113 may be utilized to provide power and ground voltage signals to integrated circuit die 120.

As shown in FIG. 1, heat sink 140 may be coupled to the back side of the integrated circuit die 120. Heat sink 140 may maintain an optimum operating temperature for integrated circuit die 120. It should be appreciated that heat sink 140 may help to dissipate excess heat generated by integrated circuit die 120 during operation. It should be noted that the optimum operating temperature for an integrated circuit die (e.g., integrated circuit die 120) may vary according to the function of the integrated circuit die 120 and the extent of its operation.

As shown in the embodiment of FIG. 1, package substrate 110 may be coupled to a top surface of integrated circuit die 120 using a flip chip technology. Package substrate 110 may include bump pads 113, micro-vias (μ-vias) 112, 114, 116 and 118, plated through-hole (PTH) via 117 and transmission line 111. Any of the bump pads 113 may be coupled to a solder ball 115 through a series of micro-vias 116, PTH via 117 and a series of micro-vias 118. In the embodiment of FIG. 1, solder balls 115 may be ball grid array (BGA) balls. Alternatively, package substrate 110 implementing a land grid array (LGA) technology, a pin grid array (PGA) technology or a surface mounted technology (SMT) may include corresponding pin structures (not shown) instead of solder balls 115. Solder balls 115 may be directly coupled to printed circuit board 130. In one embodiment, low speed I/O signals, power and/or ground voltage signals provided by an external source (e.g., a power source on or coupled to printed circuit board 130) may be transmitted to integrated circuit die 120 through a pathway that includes bump pad 113, micro-vias 116 and 118, PTH via 117 and BGA ball 115.

Bump pads 113 that are not coupled to the power source may be coupled to micro-via 112. As shown in the embodiment of FIG. 1, micro-via 112 forms a part of a signal pathway that includes transmission line 111 and micro-via 114. Micro-via 112 may be coupled to one end of transmission line 111 whereas micro-via 114 is coupled to the other end of transmission line 111. It should be appreciated that micro-via 112 and 114 may be structurally identical. In one exemplary embodiment, the pathway that includes bump pad 113, micro-vias 112 and 114 and transmission line 111 may be utilized for transmitting high speed I/O signals between an external circuit (i.e., external to integrated circuit package 100) and an integrated circuit die 120. It should be appreciated that there may be multiple pathways similar to the one shown in the embodiment of FIG. 1. In one embodiment, the number of pathways may correspond to the number of bumps 121 that may be utilized for transmitting high speed I/O signals (such as, RX signals and TX signals) for integrated circuit die 120.

In one embodiment, transmission line 111 may be a stripline transmission line. It should be appreciated that the stripline transmission line may include a signal conductor that is sandwiched between two parallel ground planes (one above the signal conductor and one below the signal conductor, whereby the ground planes are not shown in FIG. 1). The signal conductor and the ground planes for transmission line 111 may be formed using copper, for example. Transmission line 111 may be utilized to transmit high-speed signals (e.g., signals having data rates greater than 25 Gbps). In one embodiment, transmission line 111 may exhibit a characteristic impedance of 50 Ohms when it is designed to transmit single-ended signals. Alternatively, transmission line 111 may exhibit a characteristic impedance of 100 Ohms when it is designed to transmit differential signals. In general, line 111 may have any desired impedance. Transmission line 111 may have a relatively small (or, in some instances, non-existent) parasitic inductance. Therefore, the parasitic inductance may be negligible for transmission line 111 and may be disregarded in order to determine signal behavior across transmission line 111.

Referring still to FIG. 1, interposer 150 is formed partially on top of package substrate 110 and partially on top of printed circuit board 130. In one embodiment, interposer 150 may be formed as a single structure. Interposer 150 may be formed such that interposer 150 surrounds integrated circuit die 120. A top surface of interposer 150 may also be coupled to heat sink 140.

Interposer 150 may include at least one micro-strip transmission line 151. As shown in the embodiment of FIG. 1, micro-strip transmission line 151 is coupled to micro-via 114 in integrated package substrate 110. In one embodiment, micro-strip transmission line 151 may be known as a 'bridge' connection between package substrate 110 and an external circuit (e.g., printed circuit board 130). The I/O signals that are transmitted through the signal pathway (that includes bump pad 113, micro-vias 112 and 114 and transmission line 111) may then propagate through micro-strip transmission line 151 to external circuits. Micro-strip transmission line 151 may have a characteristic impedance of either 50 Ohms or 100 Ohms depending on whether micro-strip transmission line 151 is designed to transmit single-ended signals or differential signals. In general, line 151 may have any desired impedance. In one embodiment, micro-strip transmission line 151 may follow the characteristic impedance of transmission line 111. It should be appreciated that micro-strip transmission line 151 may include a signal conductor that transmits the signals (as shown in the embodiment of FIG. 1) and a ground plane (that is not shown for the sake of clarity). The ground plane may be formed in a conductive layer within interposer 150 that is directly adjacent to a conductive layer that includes the signal conductor.

Alternatively, interposer 150 may include a stripline transmission line (not shown). Interposer 150 with the stripline transmission line may include a signal conductor within an inner conductive layer of interposer 150 (rather than a signal conductor formed on a surface layer of interposer 150 for micro-strip transmission line 151). Similar to micro-strip transmission line 151, the stripline transmission line may also have a characteristic impedance of 50 Ohms (when designed to transmit single-ended signals) or 100 Ohms (when designed to transmit differential signals). Similar to transmission line 111, the signal conductor and the ground plane forming micro-strip transmission line 151 (or a stripline transmission line) may be formed from copper.

As shown in the embodiment of FIG. 1, a portion of micro-strip transmission line 151 may be coupled to micro-strip transmission line 131. Micro-strip transmission line 131 may be formed on a surface of printed circuit board 130. Micro-strip transmission line 131 may have a characteristic impedance that is similar to that of micro-strip transmission line 151 and transmission line 111. In one embodiment, micro-strip transmission line 131 may have a characteristic impedance of 50 Ohms (when micro-strip transmission line 131 is designed to transmit single-ended signals) or 100 Ohms (when micro-strip transmission line 131 is designed to transmit differential signals). In general, line 131 may have any desired impedance.

Printed circuit board 130 may include a cavity. As shown in the embodiment of FIG. 1, package substrate 110 may be placed or formed within the cavity. The cavity may be sufficiently large to accommodate the entire package substrate 110. It should be appreciated that printed circuit board 130 may also include other integrated circuit packages (not shown in FIG. 1) that are mounted on top of its surface. For example, there may be multiples devices, such as, a memory device and a microprocessor device formed on printed circuit board 130. These devices may be part of the external circuitry coupled to integrated circuit package 100.

In one embodiment, interposer 150 may be coupled to package substrate 110 and printed circuit board 130 through a copper-to-copper bonding process. The copper-to-copper bonding process may bond the copper materials within micro-strip transmission lines 131 and 151 together. Similarly, the copper-to-copper bonding process may also bond copper materials within micro-strip transmission line 151 and micro-via 114. In addition, interposer 150 may be fixed to its location using a pin or a bolt. The pin/bolt may protrude from printed circuit board 130 and prevent interposer 150 from moving freely.

The embodiment in FIG. 1 uses micro-strip transmission line 151 to couple integrated circuit package 100 and printed circuit board 130. The micro-strip transmission line 151 may have a tapered shape so that its line width at the PCB end is the same as micro-strip transmission line 131, and therefore there is a smooth dimensional transition between the structures that transmit signals. If desired, micro-strip line 151 may also have little or no parasitic inductance.

It should be appreciated that transmission lines (e.g., micro-strip transmission lines 131 and 151 and stripline transmission line 111) may also be known as conductive lines. These terms may be used herein interchangeably.

Figure 2:
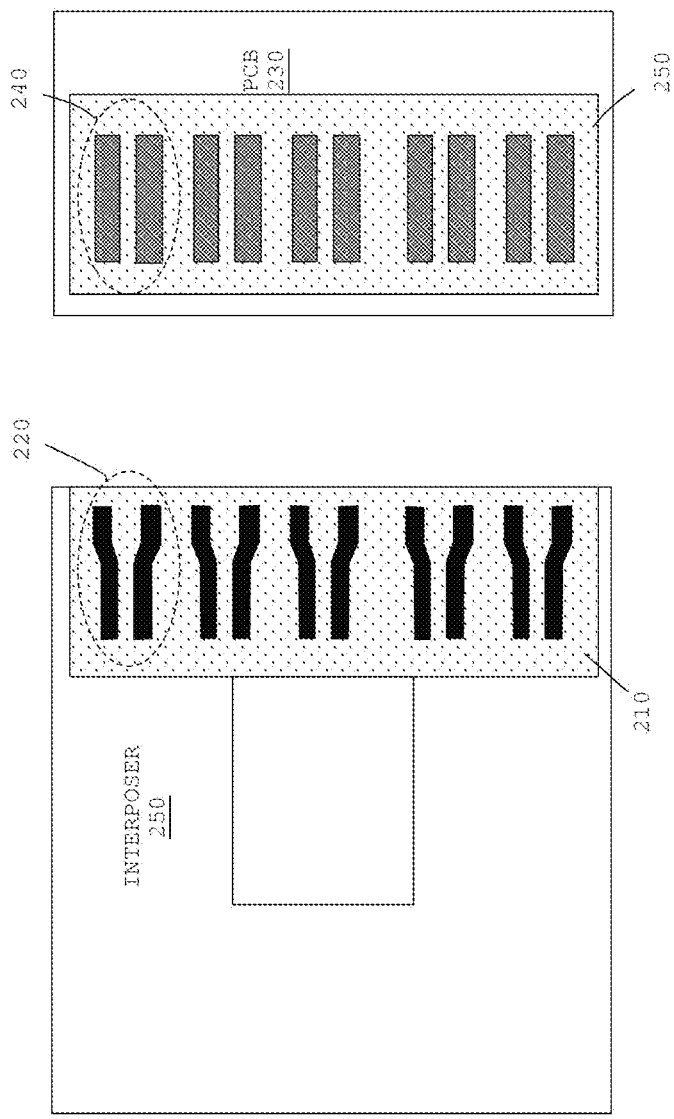
FIG. 2 shows an illustrative bottom surface of an interposer (left) and a top surface of a printed circuit board (right) in accordance with an embodiment of the present invention.

FIG. 2, meant to be illustrative and not limiting, illustrates a bottom surface of an interposer (left with respect to FIG. 2) and a top surface of a printed circuit board (right with respect to FIG. 2) in accordance with an embodiment of the present invention. Interposer 250 includes ground plane 210 and multiple signal conductors 220. Ground plane 210 may be formed on an inner conductive layer within interposer 250. The conductive layer with ground plane 220 may be adjacent to a surface layer of interposer 250 that includes signal conductors 220. In one embodiment, each signal conductor 220 and ground plane 210 collectively form a micro-strip transmission line. The micro-strip transmission line may be similar to micro-strip transmission line 151 of FIG. 1. The bottom surface of interposer 150 of FIG. 1 may be similar to the bottom surface of interposer 250, in one embodiment. In the embodiment of FIG. 2, interposer 250 includes ten signal conductors 220. Each signal conductor 220 may transmit a single-ended signal. Alternatively, a pair of signal conductors 220 may be utilized to transmit differential signals. As shown in FIG. 2, the pitch distance between two adjacent signal conductors 220 changes from a relatively small pitch distance (near the center of interposer 250) to a relatively large pitch distance (near the peripheral region of interposer 250). This is because signal conductors 220 nearer to the center region of interposer 250 may be coupled to micro-vias in a package substrate (e.g., micro-via 114 of package substrate 110 shown in FIG. 1), which may have a small pitch distance, whereas signal conductors 220 nearer to the peripheral region of interposer 250 may be coupled to PCB conductors 131 shown in FIG. 1, which may have a larger pitch distance.

Referring still to FIG. 2, printed circuit board 230 includes signal conductors 240 and ground plane 250. As shown in the embodiment of FIG. 2, signal conductor 240 and ground plane 250 are on printed circuit board 230 whereas signal conductor 220 and ground plane 210 are on interposer 250. Similar to ground plane 210, ground plane 250 may be formed on an inner conductive layer within printed circuit board 230 that is adjacent to a surface layer of printed circuit board 230 that includes signal conductors 240. Each conductor 240 and ground plane 250 form a micro-strip transmission line. In one embodiment, the micro-strip transmission line on the printed circuit board 230 may be similar to micro-strip transmission line 131 of FIG. 1. The top surface of printed circuit board 130 of FIG. 1 may be similar to the top surface of printed circuit board 230, in one embodiment. In one embodiment, top surface of printed circuit board 230 may include ten signal conductors 240. Signal conductors 240 may be utilized to transmit either a single-ended signal on each conductor 240 or differential signals on each pair of conductors 240. As shown in the embodiment of FIG. 2, the pitch distance between two adjacent signal conductors 240 may be the same along the signal conductors (unlike signal conductors 220). In general, any desired number of conductive lines 220 and 240 may be used.

Figure 3:
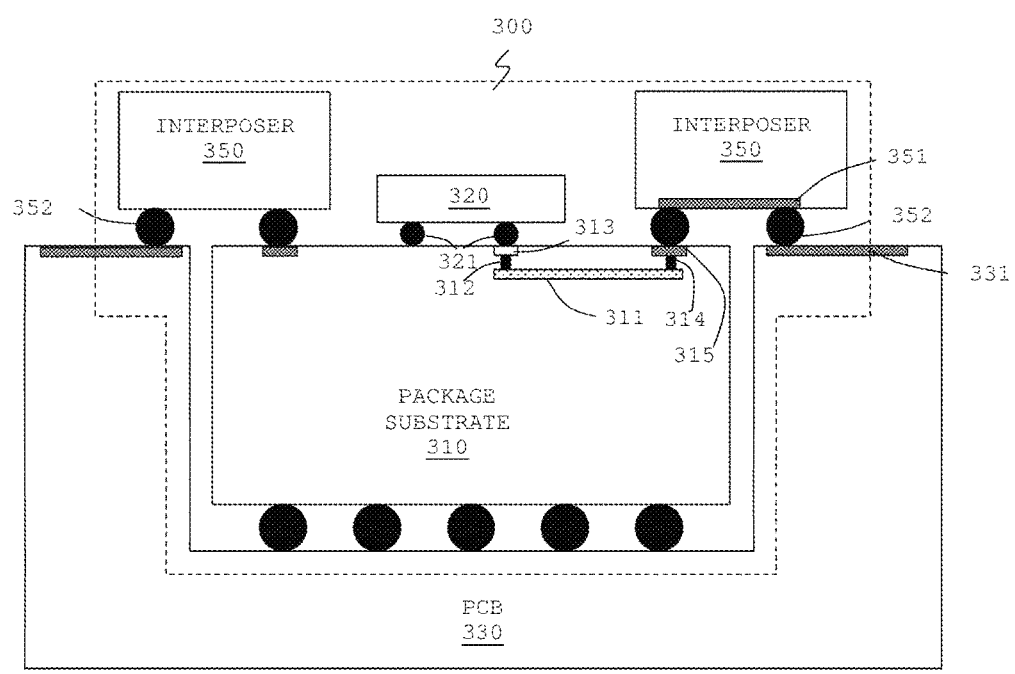
FIG. 3 shows an illustrative integrated circuit package coupled to a printed circuit board through a micro solder joint bridge interconnect in accordance with an embodiment of the present invention.

FIG. 3, meant to be illustrative and not limiting, illustrates an integrated circuit package mounted on top of a printed circuit board in accordance with an embodiment of the present invention. Integrated circuit package 300 includes integrated circuit die 320, package substrate 310 and interposer 350. Printed circuit board 330 includes a cavity where package substrate 310 may be placed or formed. In one embodiment, integrated circuit package 300, integrated circuit die 320, package substrate 310, interposer 350 and printed circuit board 330 may be similar to integrated circuit package 100, integrated circuit die 120, package substrate 110, interposer 150 and printed circuit board 130 of FIG. 1, respectively. Therefore, for the sake of brevity, the details of integrated circuit package 300, integrated circuit die 320, package substrate 310, interposer 350 and printed circuit board 330 are not repeated. Unlike the embodiment of FIG. 1, micro solder balls 352 may be utilized to couple interposer 350 to a surface of package substrate 310 and a surface of printed circuit board 330. In one embodiment, solder balls 352 may be C4 bumps, copper pillars or any conductive joints. In one embodiment, solder balls 352 may be coupled to the surface of package substrate 310 and the surface of printed circuit board 330 by using a standard solder reflow technique. In one embodiment, solder balls 352 may have a pitch distance of at least 200 micrometers (μm).

An I/O signal (or other type of data signal) transmitted from integrated circuit die 320 to printed circuit board 330 may propagate through bump 321, bump pad 313, micro-via 312, stripline transmission line 311, micro-via 314, solder pad 315, solder ball 352, micro-strip transmission line 351, solder ball 352 and micro-strip transmission line 331 (in the stated sequence). An I/O signal (or other type of data signal) transmitted from printed circuit board 330 to integrated circuit die 320 may propagate through micro-strip transmission line 331, solder ball 352, micro-strip transmission line 351, another solder ball 352, solder pad 315, micro-via 314, stripline transmission line 311, micro-via 312, bump pad 313 and bump 321 (in the stated sequence).

It should be appreciated that the embodiment of FIG. 3 may have reduced signal performance relative to the embodiment of FIG. 1 in some scenarios. This is because solder ball 352 is larger than micro-via 314, micro-strip lines 331 and 351 and transmission line 311, and hence may introduce a larger dimensional mismatch to the I/O signal being transmitted. However, this dimensional mismatch is still much smaller than a conventional BGA ball transition, and the structure in embodiment of FIG. 3 may utilize available semiconductor fabrication processes, for example the processes to form solder balls.

Figure 4:
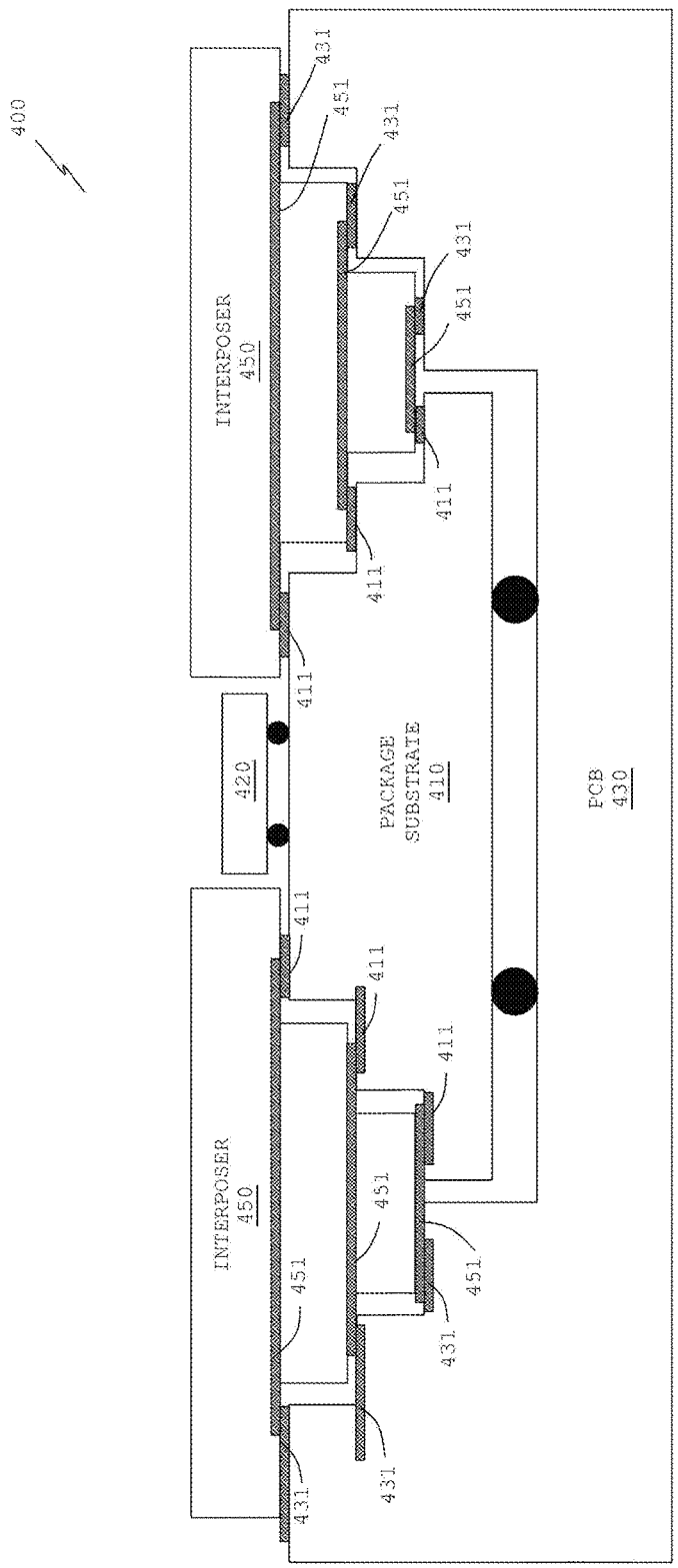
FIG. 4 shows an illustrative integrated circuit package coupled to a printed circuit board using multi-tiered bridge interconnect in accordance with an embodiment of the present invention.

FIG. 4, meant to be illustrative and not limiting, illustrates an integrated circuit package mounted on top of a multi-tiered printed circuit board in accordance with an embodiment of the present invention. Integrated circuit package 400 includes integrated circuit die 420, package substrate 410 and interposer 450. Printed circuit board 430 includes a cavity where package substrate 410 may be placed or formed. In one embodiment, integrated circuit package 400 may be similar to integrated circuit package 100 of FIG. 1 or integrated circuit package 300 of FIG. 3. However, unlike the embodiments shown in FIGS. 1 and 3, a multi-tiered package substrate 410 and multi-tiered interposer 450 are used in the structure shown in FIG. 4. As shown in the embodiment of FIG. 4, package substrate 410 and interposer 450 may have three conductive layers. The edges of package substrate 410 and interposer 450 may form steps, and therefore may be referred to as step-shaped edges. Each edge for the multi-tiered package substrate 410 may include multiple micro-strip transmission lines 411 that are connected to integrated circuit die 420 through signal pathways within the package substrate 410. In one embodiment, micro-strip transmission lines 411 may be utilized to transmit high speed signals (e.g., signals with data rates greater than 25 Gbps). Similarly, each edge for the multi-tiered interposer 450 may include micro-strip transmission lines 451. High speed data signals transmitting between package substrate 410 and printed circuit board 430 may propagate through micro-strip transmission lines 451. As shown in the embodiment of FIG. 4, the edges of package substrate 410 and interposer 450 may complement each other. Similar to multi-tiered package substrate 410 and interposer 450, printed circuit board 430 may also be formed from three layers. Edges of the cavity within printed circuit board 430 may form steps where interposer 450 may rest. As shown in the embodiment of FIG. 4, each edge for the printed circuit board 430 may include multiple micro-strip transmission lines 431.

The embodiment of FIG. 4 may have a signal performance similar to the embodiment of FIG. 1. In addition, the embodiment of FIG. 4 may be implemented when a large amount of high speed signal channels are required. In one embodiment, the structure shown in FIG. 4 may include at least three times more high speed signal channels compared to the embodiment of FIG. 1.

Figure 5:
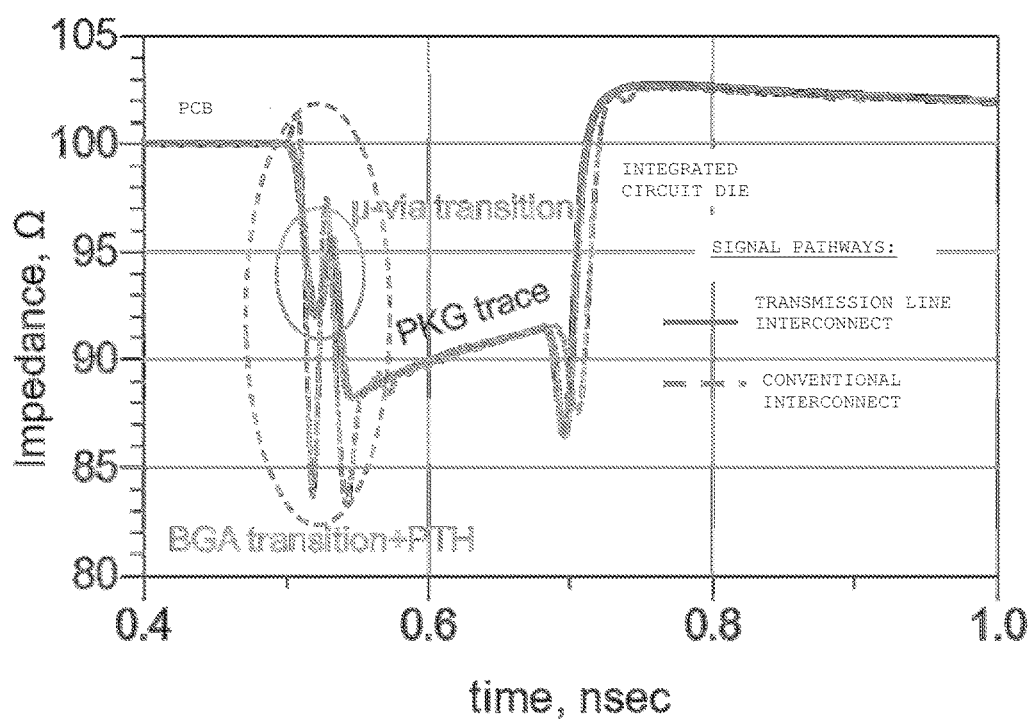
FIG. 5 shows how signal performances when a differential I/O signal is transmitted through a transmission line interconnect signal pathway may be optimized in accordance with an embodiment of the present invention.

FIG. 5, meant to be illustrative and not limiting, illustrates signal performances of a differential I/O signal when transmitted through a transmission line interconnect signal pathway (shown by a solid line) and a conventional interconnect signal pathway (shown by a dashed line) in accordance with an embodiment of the present invention. In one embodiment, the transmission line interconnect signal pathway may be similar to a signal pathway that includes solder ball 121, micro-vias 112 and 114, stripline transmission line 111 and micro-strip transmission lines 131 and 151 of FIG. 1. The conventional interconnect signal pathway may be similar to a signal pathway that includes micro-vias 116 and 118, PTH via 117 and BGA ball 115 but without corresponding transmission line structures.

Referring still to FIG. 5, the signal performance may be measured by its impedance values at different stages of the signal pathway. An impedance of 100 Ohms when transmitting differential signals may indicate a non-reflection loss signal transmission. In FIG. 5, a non-reflection signal transmission may be observed between 0.4 nanoseconds (ns) and 0.5 ns (i.e., when the I/O signal is transmitting through an ideal printed circuit board) for both signal pathways. Once the differential signals reach the integrated circuit die (e.g., integrated circuit 120 of FIG. 1) the signal performance for both signal pathways may have impedances valued at 102 Ohms (which is relatively close to 100 Ohms, and therefore may still be determined as non-reflection for an ideal die termination).

However, signal performances for the conventional signal pathway and the transmission line interconnect signal pathway differ significantly between 0.5 ns to 0.6 ns (i.e., when the differential signals are transmitted through a package substrate and an interposer). As shown in the embodiment of FIG. 5, the impedance of the conventional interconnect signal pathway fluctuates more than the impedance of the transmission line interconnect signal pathway. This is because the transmission line signal pathway may have a lower parasitic inductance and capacitance (as a result of microwave signal properties of a transmission line structure) and a lower dimensional discontinuity (as shown by I/O signal pathways of the respective embodiments of FIGS. 1, 3 and 4) compared to the conventional interconnect signal pathway.

The embodiments thus far have been described with respect to integrated circuits. The methods and apparatuses described herein may be incorporated into any suitable circuits. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other applications where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit package, comprising: a package substrate;
   an interposer structure formed over a top surface of the package substrate and a top surface of a printed circuit board, wherein the interposer structure comprises a plurality of interposer layers; and a first transmission line formed on at least one of the plurality of interposer layers, wherein the first transmission line conveys signals between the package substrate and the printed circuit board; and a second transmission line formed on the printed circuit board, wherein the first transmission line partially overlaps the second transmission line and the signals are transmitted between the first transmission line and the second transmission line.

2. The integrated circuit package defined in claim 1, wherein the transmission line comprises a transmission line selected from the group consisting of:
   a micro-strip transmission line and a stripline transmission line.

3. The integrated circuit package defined in claim 1, further comprising:
   an additional transmission line formed on the at least one of the plurality of interposer layers, wherein the transmission line transmits a first signal from the package substrate to the printed circuit board and wherein the additional transmission line transmits a second signal from the printed circuit board to the package substrate.

4. The integrated circuit package defined in claim 3, wherein the first signal transmitted from the package substrate comprises a signal selected from the group consisting of:
   a single-ended signal and a differential signal.

5. The integrated circuit package defined in claim 1, wherein a characteristic impedance of the transmission line is at least 50 Ohm.

6. The integrated circuit package defined in claim 1, wherein the interposer structure has an edge with a plurality of steps, wherein a respective transmission line is formed on each of the steps of the plurality of steps.

7. The integrated circuit package defined in claim 1, wherein the signals comprise signals selected from the group consisting of:
   input-output signals, radio-frequency data signals, power signals, and ground signals.

8. The integrated circuit package defined in claim 1, further comprising:
   an integrated circuit die formed on the package substrate, wherein the interposer structure surrounds the integrated circuit die.

9. The integrated circuit package defined in claim 1, wherein the transmission line is a first transmission line, the package substrate includes a second transmission line, the printed circuit board includes a third transmission line, and the first transmission line is coupled between the second transmission line and the third transmission line.

10. The integrated circuit package defined in claim 1, wherein the transmission line bridges a gap between the package substrate and the printed circuit board.

11. A system, comprising: an integrated circuit die; a substrate, wherein the integrated circuit die is mounted on a top surface of the substrate; an interposer formed above the substrate that at least partially surrounds the integrated circuit die; a printed circuit board, the printed circuit board comprising a cavity, wherein the substrate is formed within the cavity; and a transmission line formed within the interposer, wherein the transmission line transmits a signal between the integrated circuit die and the printed circuit board, the printed circuit board further comprises an additional transmission line at a surface of the printed circuit board that faces the interposer, and the transmission line on the interposer partially overlaps the additional transmission line on the printed circuit board so that the signal is transmitted between the additional transmission line on the printed circuit board and the transmission line on the interposer.

12. The system defined in claim 11, wherein the transmission line comprises a transmission line selected from the group consisting of:
   a micro-strip transmission line and a stripline transmission line.

13. The system defined in claim 11, wherein the transmission line is a first transmission line and the additional transmission line is a second transmission line, the system further comprising:
   a third transmission line formed within the interposer, wherein the third transmission line transmits an additional signal between the integrated circuit die and the printed circuit board and the first transmission line is formed in a first plane within the interposer and the third transmission line is formed in a second plane that is different from the first plane within the interposer.

14. The system defined in claim 11, wherein the signal transmitted by the transmission line comprises a signal selected from the group consisting of:
   a single-ended signal and a differential signal.

15. The system defined in claim 11, wherein edges of the substrate and edges of the interposer each comprise a plurality of step-shaped structures, wherein each of the step-shaped structures includes at least one corresponding transmission line.

16. An apparatus, comprising: a printed circuit board having a cavity and a first top surface; a package substrate formed within the cavity of the printed circuit board, wherein the package substrate is soldered to the printed circuit board and the package substrate has a second top surface; an interposer having a first portion that overlaps the second top surface without overlapping the first top surface and a second portion that overlaps the first top surface without overlapping the second top surface and a conductive line formed at the first top that conveys signals between the package substrate and the printed circuit board.

17. The apparatus defined in claim 16, further comprising: an integrated circuit die mounted to the second top surface, wherein the conductive line formed at the first top surface conveys the signals between the integrated circuit die and the printed circuit board.

18. The apparatus defined in claim 17, further comprising: an additional conductive line formed at a bottom surface of the interposer, wherein the bottom surface of the interposer is formed adjacent to the first top surface and the second top surface and the conductive line and the additional conductive line convey the signals between the integrated circuit die and the printed circuit board.

19. The apparatus defined in claim 18, wherein the conductive line comprises a first radio-frequency transmission line and the additional conductive line comprises a second radio-frequency transmission line.

20. The apparatus defined in claim 17, wherein the integrated circuit die transmits signals to the printed circuit board over the conductive line at a data rate greater than 25 gigabits per second.

21. The apparatus defined in claim 18, wherein a first end of the additional conductive line is electrically coupled to a first conductive pad on the second top surface and a second end of the additional conductive line is coupled to a second conductive pad on the first top surface.

22. The apparatus defined in claim 16, further comprising: an additional conductive line formed adjacent to the conductive line formed at the first top surface, wherein the conductive line and the additional conductive line comprise transmission lines that transmit differential signals.

* * * * *